United States Patent
Rogalli et al.

(10) Patent No.: US 7,169,716 B2
(45) Date of Patent: Jan. 30, 2007

(54) PHOTOSENSITIVE LACQUER FOR PROVIDING A COATING ON A SEMICONDUCTOR SUBSTRATE OR A MASK

(75) Inventors: Michael Rogalli, Rottenburg (DE); Lars Völkel, Dresden (DE)

(73) Assignee: Infineon Technologies AG, Munich (DE)

( * ) Notice: Subject to any disclaimer, the term of this patent is extended or adjusted under 35 U.S.C. 154(b) by 61 days.

(21) Appl. No.: 11/000,342

(22) Filed: Nov. 29, 2004

(65) Prior Publication Data

US 2005/0130444 A1    Jun. 16, 2005

Related U.S. Application Data

(63) Continuation of application No. PCT/DE03/01781, filed on May 30, 2003.

(30) Foreign Application Priority Data

May 31, 2002    (DE) .............................. 102 24 217

(51) Int. Cl.
*H01L 21/31*    (2006.01)
*H01L 21/469*    (2006.01)

(52) U.S. Cl. .............................. 438/780; 257/E21.193; 257/E21.027; 257/E21.273; 257/E21.53

(58) Field of Classification Search ................ 438/780, 438/706
See application file for complete search history.

(56) References Cited

U.S. PATENT DOCUMENTS 5,635,332 A * 6/1997 Nakano et al. .......... 430/270.1
5,753,416 A * 5/1998 Okamoto et al. ........... 430/311

(Continued)

FOREIGN PATENT DOCUMENTS

EP    0 701 171 A1    3/1996

(Continued)

OTHER PUBLICATIONS

Kon, J., et al., "High-performance EB chemically amplified resist using alicyclic protective groups," Advances in Resist Technology and Processing XVII, Francis M. Houlihan, Ed., Proceedings of the SPIE vol. 3999 (2000), pp. 1207-1214, Japan.

*Primary Examiner*—Walter Lindsay, Jr.
*Assistant Examiner*—Thu-Huong Dinh
(74) *Attorney, Agent, or Firm*—Slater & Matsil, L.L.P.

(57) ABSTRACT

A photosensitive resist (100) for coating on a semiconductor substrate or a mask comprises a photo acid generator (D), a solvent (E) and at least two different base polymers, of which a first base polymer comprises cycloaliphatic parent structures (A) which substantially absorb incident light at 248 nm and are substantially transparent to incident light at 193 nm, and a second base polymer comprises aromatic parent structures (B) which substantially absorb incident light at 193 nm and are substantially transparent to incident light at 248 nm. If such a resist (100) is applied in a coat thickness of from 50 to 400 nm to a substrate and the proportion of the second base polymer having the aromatic parent structure is between 1 and 25 mol %, a relatively high structure contrast, better stability to etching and a reduction of defects are advantageously achieved in an exposure at a wavelength of 193 nm. Exposure over the entire depth range of the resist (100) is ensured thereby.

20 Claims, 1 Drawing Sheet

U.S. PATENT DOCUMENTS

| | | |
|---|---|---|
| 5,759,739 A | 6/1998 | Takemura et al. |
| 6,045,968 A | 4/2000 | Ushirogouchi et al. |
| 6,063,549 A * | 5/2000 | Schadeli et al. ............ 430/325 |
| 6,284,429 B1 | 9/2001 | Kinsho et al. |
| 6,399,274 B1 | 6/2002 | Kinsho et al. |
| 6,492,092 B1 * | 12/2002 | Foster et al. ............. 430/271.1 |
| 6,531,403 B1 * | 3/2003 | Ezaki ......................... 438/710 |
| 6,537,724 B1 | 3/2003 | Lee et al. |
| 6,680,157 B1 * | 1/2004 | Fedynyshyn ............. 430/270.1 |
| 6,849,373 B1 * | 2/2005 | Pavelchek et al. ....... 430/270.1 |
| 6,946,736 B1 * | 9/2005 | Gleason et al. ............. 257/758 |
| 7,090,961 B1 * | 8/2006 | Kobayashi et al. ...... 430/270.1 |
| 2001/0036593 A1 | 11/2001 | Takeda et al. |
| 2002/0058199 A1 | 5/2002 | Zampini et al. |
| 2004/0101779 A1 * | 5/2004 | Wu et al. ................. 430/271.1 |
| 2006/0194147 A1 * | 8/2006 | Kawanishi ............... 430/270.1 |

FOREIGN PATENT DOCUMENTS

| | | |
|---|---|---|
| EP | 1 031 879 A1 | 8/2000 |
| EP | 1 096 317 A1 | 5/2001 |
| GB | 2 360 774 A | 10/2001 |

* cited by examiner

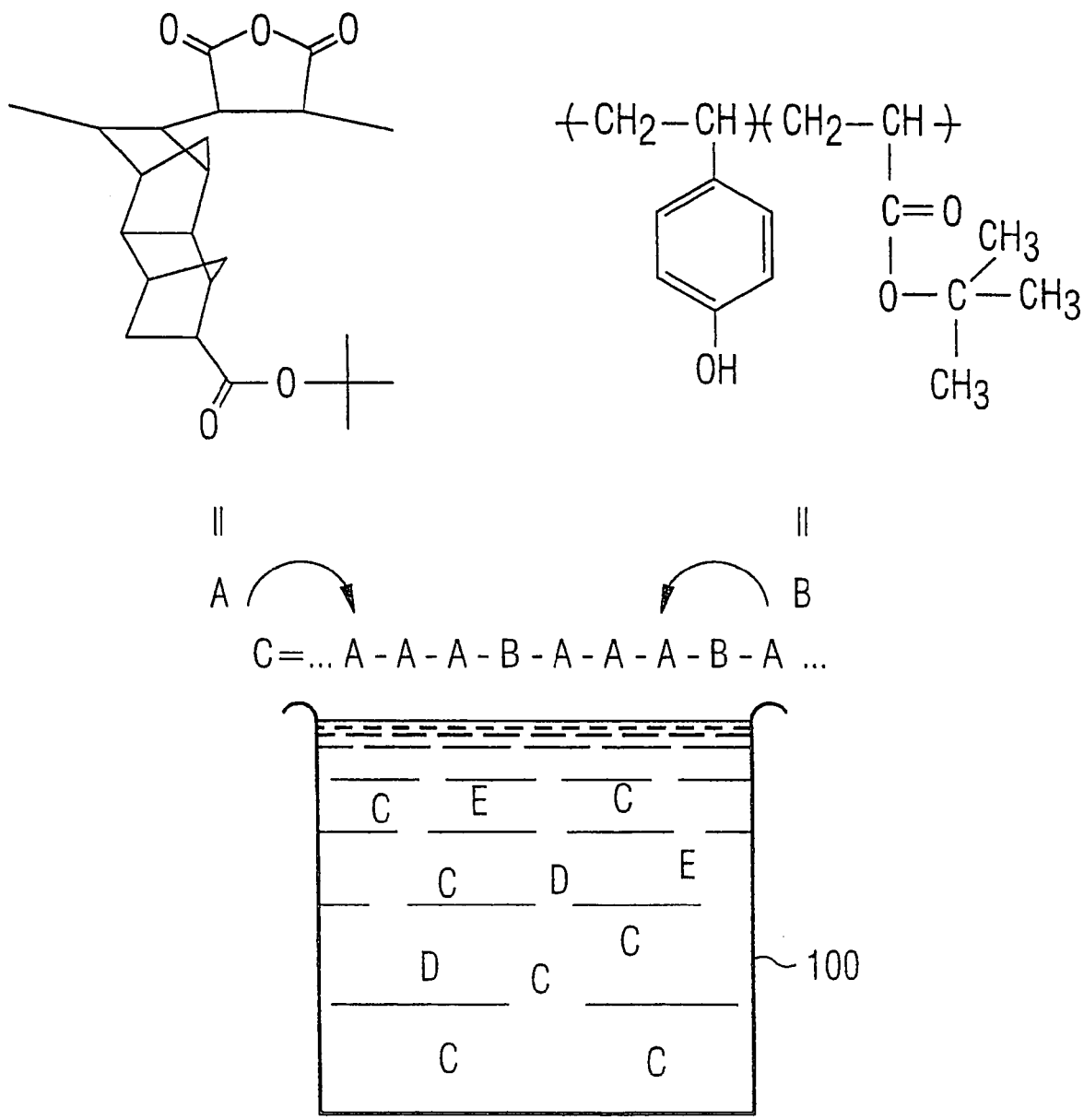

PHOTOSENSITIVE LACQUER FOR PROVIDING A COATING ON A SEMICONDUCTOR SUBSTRATE OR A MASK

This application is a continuation of co-pending International Application No. PCT/DE03/01781, filed May 30, 2003, which designated the United States and was not published in English, and which is based on German Application No. 102 24 217.8 filed May 31, 2002, both of which applications are incorporated herein by reference.

TECHNICAL FIELD

The present invention relates to photosensitive resist for coating on a semiconductor substrate or a mask.

BACKGROUND

For the production of integrated circuits in the semiconductor industry, semiconductor substrates or masks, as precursors for the exposure of the semiconductor substrates to light, are coated with photosensitive resists, which are then exposed to light in a photolithographic step with a structure representing a component of the circuit. Depending on the formation of the resist as a positive or negative resist, the exposed or unexposed structures are used, after a development step, as an etch or implantation mask, etc., for transferring the structures to the substrate or the mask.

Owing to the progressive increase in the integration density on the substrates or masks, the sizes of structures to be achieved on the substrates or masks are decreasing. The minimum achievable structure size is related linearly to the wavelength of the light used in the photolithographic step. This means that changeovers to technology generations with reduced structure size often necessitate the provision of exposure apparatuses which operate at shorter wavelength. Thus, in recent years, the changeover from wavelengths of 365 nm through 248 nm to currently 193 nm for the photolithographic structuring was implemented.

A photosensitive resist typically comprises one or more photoactive substances, a coat-forming base polymer and a solvent. The solvent serves for applying the resist to the substrate. The photoactive substance acts on the base polymer on exposure to light in a certain wavelength with a change in its chemical properties. Exposed parts therefore differ chemically from the unexposed parts, so that the desired parts can be dissolved away selectively in a developer process.

For the formation of a mask in the resist, for example for an etching step, it is necessary for the incident light to penetrate the resist coat down to the bottom surface of the resist coat. The resist used must in each case therefore be transparent to the incident light. Moreover, the photoactive substance must also have sufficient sensitivity to the given wavelength of the incident light. In general, however, the resists used in the photolithographic structuring are transparent only over a limited wavelength range. Thus, for example, the diazonaphthoquinone conventionally used as the photoactive substance, in combination with a novolak resin, can be employed only over a wavelength range from about 300 to 450 nm for the incident light.

For formation of structures having widths of 90–110 nm, ArF excimer lasers having a wavelength of 193 nm are currently used. Photosensitive resists, which can be used in the deep ultraviolet (DUV) wavelength range, comprise, as photoactive substance, a photo acid generator which, on absorption of the incident light, liberates an acid that produces an alkali-soluble acid group through acid-catalyzed deblocking of the alkali-insoluble base polymer. This applies, for example, when a positive resist is employed.

The photosensitive resist for the photolithographic structuring at 193 nm comprises a base polymer that is substantially composed of cycloaliphatic parent structures and is transparent precisely at this wavelength. However, the resists still give rise to considerable problems in the transfer of the structure to the substrate. Thus, for example in the case of the exposed and developed structures, roughened edges leading to insufficient passivation of the sidewalls occur to a particular extent. Owing to a reduced stability of the resist walls remaining after the development, they may collapse, for example, also in a subsequent measurement of the structure width in a scanning electron microscope. A further disadvantage arises by virtue of the fact that conventional resists transparent at a wavelength of 193 nm interact chemically with the antireflection coats underneath them, so that resist residues within the tracks between the resist walls may occur.

The use of even thinner resist systems with simultaneous treatment of the substrate with, for example, hard carbon masks has been proposed to date as a solution. However, this leads to a considerably increased process complexity.

SUMMARY OF THE INVENTION

It is therefore the object of the present invention to provide a resist system that reduces the above-mentioned problems and permits an improvement in the quality on transfer of the structure of resist structures to underlying coats.

The object is achieved by a photosensitive resist having a photo acid generator, a solvent and at least two different base polymers. A first base polymer includes cycloaliphatic parent structures that absorb incident light at 248 nanometers and are transparent to incident light at 193 nanometers and a second base polymer includes aromatic parent structures that absorb incident light at 193 nanometers and are transparent to incident light at 248 nanometers. The object is furthermore achieved by a use of the photosensitive resist for the formation of coating a workpiece. Respective advantageous developments are described in the specification and claims.

The present invention accordingly comprises the photosensitive resist, similarly to the case of conventional photosensitive resists that can be used in the ultraviolet wavelength range, a photo acid generator and a solvent, but, for the formation of the polymer matrix in a cured resist, the resist has at least two different base polymers. A first base polymer comprises cycloaliphatic parent structures. As a further property, these parent structures have a transparency to incident light, in particular in the wavelength range around 193 nm, which corresponds to the incident light of the ArF excimer laser used for the 90–110 nm structure technologies. In comparison, this first base polymer is substantially nontransparent to incident light of 248 nm.

The wavelength of 248 nm corresponds to the incident light radiation, which is produced by a KrF excimer laser for photolithographic structuring, and usually corresponds to the next lowest technology generation above 130 nm structure width.

The at least one second base polymer, on the other hand, comprises aromatic parent structures as are conventionally used precisely for the 248 nm laser. The second base polymer has the property of being nontransparent at an incident light wavelength of 193 nm, while it is transparent to light at 248 nm.

The ranges of the stated wavelengths for the transparency of the base polymers are in each case at least so large that a substantial part of the starting spectrum of the KrF (248 nm) or ArF excimer laser (193 nm) in its corresponding resonance mode is covered thereby.

According to two advantageous developments, at least two base polymers are present as block copolymers, or they are present together in a blend without chemical bonds being established. It was found that, by means of the resist according to the invention, the advantages applicable in each case for their wavelength range can also be utilized in a blend or block copolymer formation of the at least two polymer substances for effecting structure transfer with high resolution if also only one of the wavelengths, in particular 193 nm, is used for the incident light. The respective volume fractions of the base polymers and the total coat thickness of the resist are to be chosen so that, in spite of the absorption property of the one base polymer at the given light wavelength, exposure down to the bottom surface of the resist is ensured.

If, for example, a second base polymer having aromatic parent structures and provided with a lower mole fraction in comparison with the first base polymer having cycloaliphatic parent structures is used at an exposure wavelength of 193 nm, this gives rise to an advantage that an interaction of the resist with the substrate is reduced. Consequently, resist residues after an exposure and development process in the exposed structures are considerably reduced. This is due to the polymer components of the second base polymer containing the aromatic parent structures.

The additional fractions of the second polymer also ensure that the roughness of the resist sidewalls after an etching process is reduced owing to the aromatic moiety. The reason for this is an improved fluorine sidewall passivation in the exposed structures, which leads firstly to increased stability of remaining walls as well as to dimensionally stable structure transfer. Moreover, the so-called etch bias, a reserve for the etching which has to be used for compensating the effect described, is thus likewise advantageously reduced. A further advantage is the increased etch resistance which is provided by the aromatic moiety, for reducing the resist thickness and consequently for the stability of the resist mask.

On the other hand, the total absorption or the depth of penetration of the incident light is influenced only to an insignificant extent by the absorption properties, owing to the small mole fraction of the second base polymer comprising the aromatic parent structures. Only with slight additional process complexity, this could be compensated by a reduced resist thickness, and increased light intensity or a longer exposure time.

According to a particularly advantageous development, the proportion of the second base polymer, based on all base polymers used, is between 1 and 25 mol %. With such a fraction, the photosensitive resist still has sufficient transparency in particular at an incident light wavelength of 193 nm, because the complementary base polymers comprising cycloaliphatic parent structure are completely transparent here. Depending on the proportion, the coat thicknesses on the semiconductor substrate or the mask can be adapted in such a way that, in spite of the mean absorption coefficient of the resist material, increased by the nontransparent base polymer, the resist coat can be illuminated down to its bottom surface. For the above-mentioned ratio of the base polymers, a particularly advantageous value of 50–400 nm for the coat thickness of such resists was found.

BRIEF DESCRIPTION OF THE DRAWINGS

The invention is to be explained in more detail with reference to an embodiment with the aid of a drawing. Therein:

The FIGURE schematically shows a blend of two different base polymers in a resist, in each case comprising cycloaliphatic and aromatic parent structures.

The following list of reference symbols can be used in conjunction with the FIGURES:
A First base polymer having cycloaliphatic parent structures
B Second base polymer having aromatic parent structures
C Block copolymer
D Photo acid generator (PAG)
E Solvent
100 Photosensitive resist

DETAILED DESCRIPTION OF ILLUSTRATIVE EMBODIMENTS

The FIGURE shows a photosensitive resist 100 with solvents E, acid generators D and with first base polymers which are synthesized as block copolymers C and comprise cycloaliphatic parent structures A, and second base polymers which comprise aromatic parent structures B. The fraction of the second base polymers containing aromatic parent structures B, based on all base polymers A, B, is 5 mol %. In this embodiment, the second base polymer having aromatic parent structures B comprises poly(4-hydroxystyrene), which is blocked by acid-sensitive tert-butoxycarbonyl groups.

The first base polymer having the cycloaliphatic parent structures A comprises an acid-sensitive blocking group, which in this case is a polymethacrylate. It also comprises an alkali-soluble unit of cycloolefinmaleic anhydride.

The resist is prepared with a polymer synthesis using the stated mole fractions of the base polymers. This resist is applied to a wafer in a coat thickness of 100–150 nm, preheated to a so-called prebake step for removing the solvent from the photoresist and exposed to ultraviolet light of 193 nm wavelength in the desired parts for the formation of a structure. Owing to the small fraction of the base polymers which have the aromatic parent structures B and are nontransparent at this wavelength, the resist is nevertheless sufficiently transparent to the incident light so that it is completely exposed in the irradiated parts down to its bottom surface which is adjacent to an antireflection coat (ARC).

After a so-called postexposure bake step, the resist is developed and the polymer components converted as a result of the exposure by means of the liberated acid are removed. Adding the second base polymer comprising the aromatic parent structures B, a high stability to etching is achieved. The thickness of the resist of between 100 and 150 nm in combination with the fraction of 5% of the second base polymer containing aromatic parent structures B, ensures complete exposure of the desired structures over all depth ranges of the resist.

What is claimed is:
1. A method of lithographically patterning a workpiece, the method comprising:
providing a workpiece;

coating the workpiece with a photosensitive resist, the
  photosensitive resist comprising:
  a photo acid generator;
  a solvent;
  at least two different base polymers that form block
    copolymers, of which a first base polymer comprises
    cycloaliphatic parent structures that absorb incident
    light at 248 nanometers and are transparent to inci-
    dent light at 193 nanometers, and second base poly-
    mer comprises aromatic parent structures that absorb
    incident light at 193 nanometers and are transparent
    to incident light at 248 nanometers.

2. The method as claimed in claim 1, wherein coating the workpiece comprises coating the workpiece in a coat thickness of less than 400 nanometers and more than 50 nanometers.

3. The method as claimed in claim 1, further comprising exposing portions of the photosensitive resist with light having a wavelength of 193 nanometers.

4. The method as claimed in claim 1 wherein providing a workpiece comprises providing a mask.

5. The method as claimed in claim 1 wherein providing a workpiece comprises providing a semiconductor substrate.

6. The method as claimed in claim 1 and further comprising heating the workpiece after coating but before exposing.

7. The method as claimed in claim 6 and further comprising developing the photosensitive resist.

8. The method as claimed in claim 1, and further comprising developing the photosensitive resist.

9. The photosensitive resist as claimed in claim 1, wherein, of the base polymers in the resist, the first base polymer comprising the cycloaliphatic parent structures has a proportion of more than 75 mol % and of less than 99 mol %.

10. The photosensitive resist as claimed in claim 1, wherein, of the base polymers in the resist, the second base polymer comprising the aromatic parent structures has a proportion of more than 1 mol % and of less than 25 mol %.

11. A method of producing an integrated circuit, the method comprising:
  providing a semiconductor substrate;
  coating the substrate with a photosensitive resist, the
    photosensitive resist comprising:
    a photo acid generator;
    a solvent;
    at least two different base polymers, of which a first
      base polymer comprises cycloaliphatic parent struc-
      tures that absorb incident light at 248 nanometers
      and are transparent to incident light at 193 nanom-
      eters, and second base polymer comprises aromatic
      parent structures that absorb incident light at 193
      nanometers and are transparent to incident light at
      248 nanometers;
  exposing portions of the photosensitive resist to radiation
    so as to create removeable resist portions;
  removing the removeable resist portions; and
  implanting exposed portions of the semiconductor sub-
    strate.

12. The method as claimed in claim 11 wherein effecting comprises etching.

13. The method as claimed in claim 11, wherein coating the substrate comprises coating the substrate with a coat thickness of less than 400 nanometers and more than 50 nanometers.

14. The method as claimed in claim 11, wherein exposing portions of the workpiece comprises exposing with light having a wavelength of 193 nanometers.

15. The method as claimed in claim 11 and further comprising heating the substrate after coating but before exposing.

16. The method as claimed in claim 15 and further comprising developing the photosensitive resist.

17. The method as claimed in claim 11 and further comprising developing the photosensitive resist.

18. The photosensitive resist as claimed in claim 11, wherein, of the base polymers in the resist, the first base polymer comprising the cycloaliphatic parent structures has a proportion of more than 75 mol % and of less than 99 mol %.

19. The photosensitive resist as claimed in claim 11, wherein the at least two different base polymers are present together in a blend without chemical bonds being established.

20. The photosensitive resist as claimed in claim 11, wherein, of the base polymers in the resist, the second base polymer comprising the aromatic parent structures has a proportion of more than 1 mol % and of less than 25 mol %.

* * * * *